(12) United States Patent
Nguyen et al.

(10) Patent No.: US 8,514,611 B2
(45) Date of Patent: Aug. 20, 2013

(54) MEMORY WITH LOW VOLTAGE MODE OPERATION

(75) Inventors: Huy B. Nguyen, Austin, TX (US); Troy L. Cooper, Austin, TX (US); Ravindraraj Ramaraju, Round Rock, TX (US); Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 296 days.

(21) Appl. No.: 12/850,533

(22) Filed: Aug. 4, 2010

(65) Prior Publication Data

US 2012/0033520 A1 Feb. 9, 2012

(51) Int. Cl.
*G11C 11/00* (2006.01)

(52) U.S. Cl.
USPC ............ 365/154; 365/226; 365/227; 365/229

(58) Field of Classification Search
USPC .................................. 365/154, 226, 227, 229
See application file for complete search history.

(56) References Cited

U.S. PATENT DOCUMENTS

| | | | |
|---|---|---|---|
| 5,715,191 A * | 2/1998 | Yamauchi et al. | ............ 365/156 |
| 6,320,795 B1 | 11/2001 | Balamurugan et al. | |
| 6,801,470 B2 | 10/2004 | Clark et al. | |
| 7,055,007 B2 | 5/2006 | Flautner et al. | |
| 7,061,820 B2 | 6/2006 | Deng | |
| 7,209,395 B2 | 4/2007 | Hsu et al. | |
| 7,292,495 B1 | 11/2007 | Kenkare et al. | |
| 7,366,036 B2 | 4/2008 | Cheng et al. | |
| 7,400,523 B2 | 7/2008 | Houston | |
| 7,400,545 B2 | 7/2008 | Ramaraju et al. | |
| 7,443,759 B1 | 10/2008 | Rowlands et al. | |
| 7,453,756 B2 | 11/2008 | Moyer et al. | |
| 7,533,226 B2 | 5/2009 | Flautner et al. | |
| 7,706,200 B2 | 4/2010 | Chi | |
| 2007/0268740 A1 * | 11/2007 | Aly et al. | ........................ 365/154 |
| 2009/0161412 A1 * | 6/2009 | Suzuki et al. | .................. 365/154 |
| 2009/0213673 A1 * | 8/2009 | Flautner et al. | ................ 365/203 |
| 2009/0285046 A1 | 11/2009 | Ehrenreich et al. | |
| 2009/0323401 A1 | 12/2009 | Huang et al. | |

FOREIGN PATENT DOCUMENTS

| GB | 2419010 A | 4/2006 |
|---|---|---|
| WO | 01/33322 A2 | 5/2001 |

OTHER PUBLICATIONS

Bhavnagarwala et al.; "A Pico-Joule Class, 1GHz, 32 KByte×64b DSP SRAM with Self Reverse Bias"; 2003 Symposium on VLSI Circuits Digest of Technical Papers; 2003; pp. 251-252; IEEE.

(Continued)

*Primary Examiner* — Pho M Luu
*Assistant Examiner* — Thao Bui
(74) *Attorney, Agent, or Firm* — David G. Dolezal

(57) ABSTRACT

A memory comprising memory cells wherein the memory is configured to operate in a normal voltage mode and a low voltage mode. The method includes during the normal voltage mode, operating the memory cells at a first voltage across each of the memory cells. The method further includes upon transitioning from the normal voltage mode to the low voltage mode, operating the memory cells at a second voltage across each of the memory cells, wherein the second voltage is lower than the first voltage. The method further includes performing an access on a subset of the memory cells while maintaining the second voltage across the memory cells.

20 Claims, 5 Drawing Sheets

(56) References Cited

OTHER PUBLICATIONS

Khellah et al.; "A 256-KB Dual VCC SRAM Building Block in 65-nm CMOS Process With Actively Clamped Sleep Transistor"; IEEE Journal of Solid-State Circuits; Jan. 2007; pp. 233-242; vol. 42, No. 1; IEEE.

Tschanz et al.; "Dynamic Sleep Transistor and Body Bias for Active Leakage Power Control of Microprocessors"; IEEE Journal of Solid-State Circuits; Nov. 2003; pp. 1838-1845; vol. 38, No. 11; IEEE.

Zhang et al.; "Low-Power SRAMs in Nanoscale CMOS Technologies"; IEEE Transactions on Electron Devices; Jan. 2008; pp. 145-151; vol. 55, No. 1; IEEE.

Takashima et al.;Standy/Active Mode Logic for Sub-1-V Operating ULSI Memory; IEEE Journal of Solid-State Circuits; Apr. 1994; pp. 441-447; vol. 29, No. 4; IEEE.

Chang et al.; "The 65-nm 16-MB Shared On-Die L3 Cache for the Dual-Core Intel Xeon Processor 7100 Series"; IEEE Journal of Solid-State Circuits; Apr. 2007; pp. 846-852; Vo 42, No. 4; IEEE.

Chen et al.; "A 0.6 V Dual-Rail Compiler SRAM Design on 45 nm CMOS Technology With Adaptive SRAM Power for Lower $VDD\_min$ VLSIs"; IEEE Journal of Solid-State Circuits; Apr. 2009; pp. 1209-1215; vol. 44, No. 4; IEEE.

Wang et al.; "A 4.0 GHz 291 Mb Voltage-Scalable SRAM Design in a 32 nm High-k + Metal-Gate CMOS Technology With Integrated Power Management"; IEEE Journal of Solid-State Circuits; Jan. 2010; pp. 103-110; vol. 45, No. 1; IEEE.

EP Application No. 11170299.9, International Search Report and Written Opinion dated Oct. 19, 2011. Claims in the EPC for the present application have been amended subsequent to this search report.

U.S. Appl. No. 12/372,997, filed Feb. 18, 2009.

U.S. Appl. No. 12/622,277, filed Nov. 19, 2009.

U.S. Appl. No. 12/843,547, filed Jul. 26, 2010.

Gerosa, G. et al., "A Sub-1W to 2W Low-Power 1A Processor for Mobile Internet Devices and Ultra-Mobile PCs in 45nm Hi-K Metal Gate CMOS", ISSCC 2008, Session 13, Mobile Processing, pp. 256-258.

\* cited by examiner

MEMORY WITH LOW VOLTAGE MODE OPERATION

BACKGROUND OF THE INVENTION

1. Field of the Invention

This invention relates in general to memories and more specifically to memory operation in a low voltage mode.

2. Description of the Related Art

Memories such as DRAMs, SRAMs, Flash, and MRAMs operate at a specific voltage levels to ensure proper operation for storing, writing, and reading of information. Memories may be implemented in devices such as processors or data processing systems to store information.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As described herein, a memory includes circuitry for operating at a lower voltage in a low voltage mode than during a normal voltage mode. The memory can be accessed at a normal voltage that is supplied to the cells and bit lines and also at a reduced voltage for operating in a low voltage mode.

Figure 1:
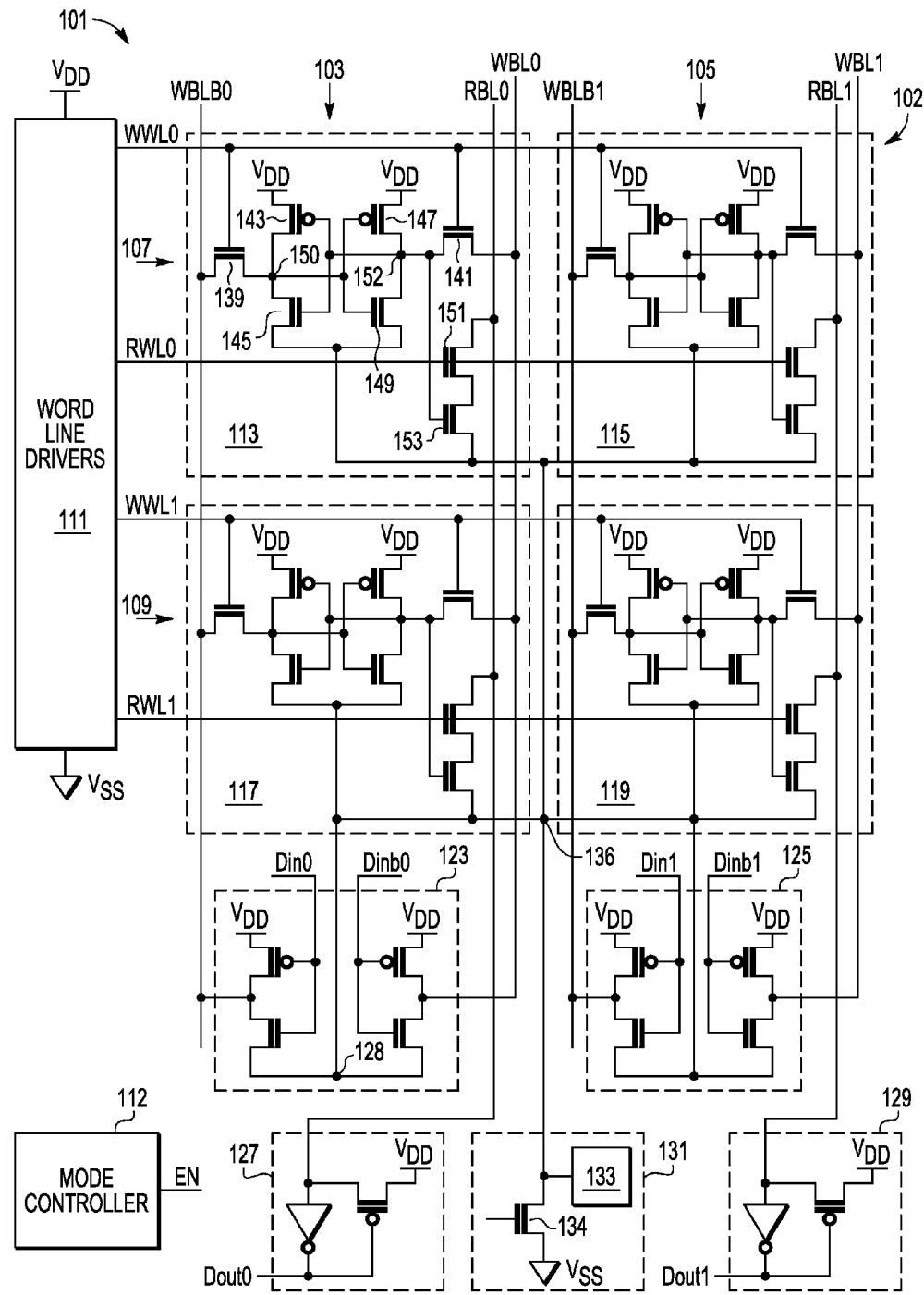
FIG. 1 is a circuit diagram of a memory according to one embodiment of the present invention.

FIG. 1 is a circuit diagram of a memory according to one embodiment of the present invention. In the embodiment shown, memory 101 includes a 2×2 array 102 of SRAM memory cells located in rows 107 and 109 and columns 103 and 105. Column 103 includes cells 113 and 117, and column 105 includes cells 115 and 119. Memory 101 also includes word line drivers 111 that provides word line signals on write word lines WWL0 and WWL1 to the cells of rows 107 and 109, respectively, and read word lines RWL0 and RWL1 to cells of rows 107 and 109, respectively.

In the embodiment of FIG. 1, the cells of column 103 are coupled to write bit lines WBL0 and WBLB0 and read bit line RBL0. The cells of column 105 are coupled to write bit lines WBL1 and WBLB1 and read bit line RBL1. Bit line driver 123 is used to write data, as conveyed on data in lines Din0 and Dinb0, to the cells of column 103. Bit line driver 125 is used to write data, as conveyed on data in lines Din1 and Dinb1, to the cells of column 105.

Each bit line driver (123 and 125) includes two inverters each composed of a PMOS and NMOS transistor coupled in series between a VDD terminal and node 136. The input of the inverter is connected to a data in line and the output is connected to a write bit line. For example, data in line Din0 is connected to an input of an inverter of bit line driver 123, wherein the output of the inverter is connected to write bit line WBLB0. In one embodiment, each column, may include a column select transistor (not shown) that isolates the bit line driver from a bit line when a column is not selected.

In the embodiment shown, each cell of array 102 is an 8 transistor SRAM memory cell. Cell 113 includes word line transistors 139 and 141, cross coupled transistors 143, 145, 147, and 149 which are coupled to form storage nodes 150 and 152, and read transistors 151 and 153 that constitute the read port. NMOS transistors 139 and 141 have gates connected to write word line WWL0. During a write operation, when WWL0 is high (at its asserted state for the embodiment shown) to write a value to cells 113 and 115, transistor 139 is conductive to enable a current path from WBLB0 to storage node 150 and transistor 141 is conductive to enable a current path from WBL0 to storage node 152 to set those nodes to complementary voltages indicative of a stored value as controlled by the data in signals DIN0 and DINB0. The complementary voltage values remain on nodes 150 and 152 after WWL0 goes back to a low voltage state. Cell 115 is written to in the same way as per the data in DIN1 and DINB1.

Cell 113 also includes read transistors 151 and 153 to set the voltage of read bit line RBL0 to a voltage dependent upon the voltage of node 152 during a read of cell 113. The gate of transistor 151 is connected to RWL0 and is conductive when that word line is at an asserted state (at a high voltage level in the embodiment of FIG. 1). The voltage of node 152 controls whether transistor 153 is conductive or not to couple read bit line RBL0 to lower supply voltage node 136 or not. If transistor 153 is not conductive during a read, then the voltage of RBL0 remains at the precharged VDD level. The read bit lines RBL0 and RBL1 are coupled to output drivers 127 and 129, respectively, to provide the output data from the memory cells during a read operation. Cells 115, 117 and 119 are configured and operate in a similar manner. During a read, the data stored in row 107 or 109 is read in parallel.

In the embodiment shown, the sources of transistors 143 and 147 are connected to power supply terminal VDD. The sources of transistor 145 and 149 are connected to node 136. In the embodiment shown, the voltage from the node of the sources of transistors 143 and 147 to the node of the sources of transistors 145 to 149 is referred to as the "voltage across the memory cell." Operating characteristics of memory cell 113 (as well as other memory cells) are controlled by the voltage across the memory cell.

Memory 101 includes a lower supply voltage node 136 that can be selectively set during one mode of operation at a system ground voltage value (VSS) during normal operation and at a voltage higher than system ground value (VVSS) during a low voltage mode. The voltage of node 136 is controlled by a voltage regulator circuit 131 that includes a regulator 133 and select transistor 134 whose gate is controlled by an enable signal (EN) provided by mode controller 112. When the enable signal is at a low value, transistor 134 is non conductive and the voltage of node 136 is set by regulator 133 to the virtual ground value VVSS. When the enable signal EN is at a high value, node 136 is pulled to system ground (VSS). By being able to selectively increase the voltage at node 136, the circuit 131 can be used to selectively control the voltage across the memory cells of array 102.

The enable signal EN is controlled by mode controller 112. Mode controller 112 controls an operating mode of memory 101. The operating mode can be set by a software program such as an operating system controlling the system that memory 101 is implemented in or by a separate circuit (not shown) such as a power management unit.

Although a 2×2 array is shown in FIG. 1, array 102 can include a different number of rows and/or columns such that memory 101 can include a significantly greater number of cells than that shown in FIG. 1. Also in other embodiments, memory 101 can have other configurations (such as having combined write and read word lines or combined write and read bit lines), include other circuitry (e.g. sense amplifiers), and/or include other types of memory cells (e.g. DRAM, MRAM, 6 cell SRAM etc.). For example, memory 101 can include column select circuitry that allows one data out line to be selectively couplable to multiple columns. Also, some embodiments may have only one bit line per column.

Figure 2:
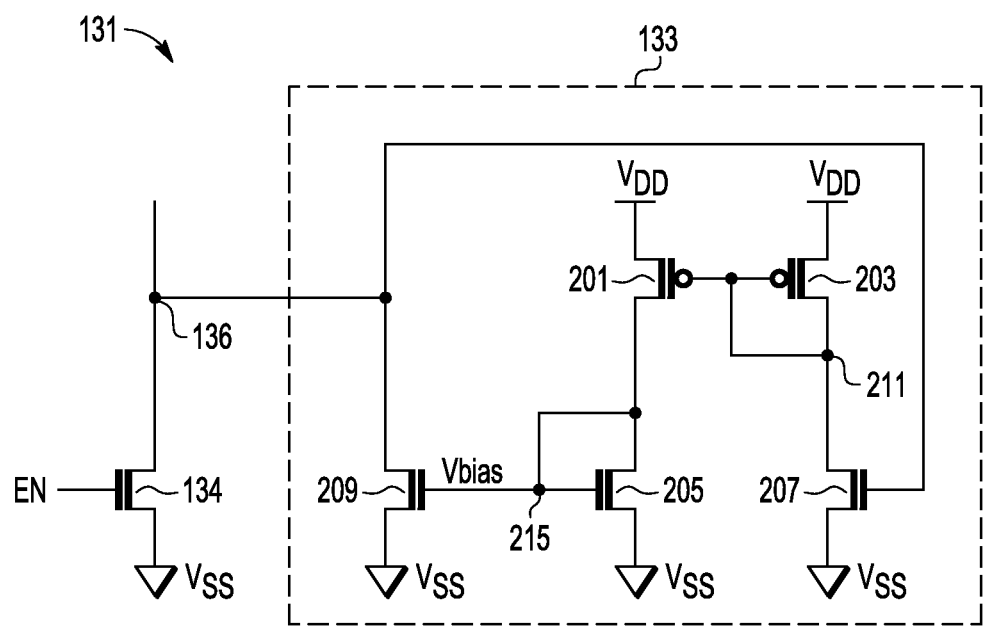
FIG. 2 is a circuit diagram of a voltage regulator circuit according to one embodiment of the present invention.

FIG. 2 is a circuit diagram of voltage regulator circuit 131. Regulator 133 includes transistors 209, 205, 207, 201, and 203. When transistor 134 is conductive node 136 is pulled to system ground (VSS). When transistor 134 is non conductive, the voltage of node 136 is set by the gate to source voltage of transistor 207. When transistor 134 is non conductive, the leakage current through the bit cells of array 102 charges node 136 to a value higher than VSS (VVSS). This voltage makes transistor 207 partially conductive to pull node 211 to a voltage lower than VDD which partially turns on transistors 201 and 203. Due to the partial conductivity of transistor 201, node 215 is pulled to a value that is higher than VSS. This voltage makes transistor 209 and 205 partially conductive. Thus, transistor 209 counter acts the voltage on node 136 from rising above a predetermined value (VVSS). In one embodiment, VVSS is 300 mV above VSS, but may be of different values from VSS in other embodiments.

Other types of regulators may be used in other embodiments including regulators having a programmable or adjustable values. Regulator circuit 131 is referred to a drowsy regulator. In some embodiments, regulator circuit 131 may include multiple regulators similar to regulator 133 and transistors 134. For example, different blocks of cells of array 102 may each be associated with a different regulator (similar to regulator 133) and select transistor (similar to select transistor 134) of the regulator circuit. Other embodiments may utilize other types of regulator circuits for selectively providing a higher voltage at node 136.

Referring back to FIG. 1, in addition to controlling the voltage across the cells for array 102, virtual ground node 136 also is coupled to the bit line drivers 123 and 125. In the embodiment shown, the sources of the NMOS transistors of drivers 123 and 125 are connected to node 136. Accordingly, the lowest voltage a write bit line can be discharged to is also the voltage of virtual ground node 136.

During normal operation, the enable signal is at a high voltage level to pull the voltage of node 136 to VSS. Thus, the voltage across the cells of array 102 is VDD-VSS or VDD since VSS is system ground. During a write operation in the normal operating mode, one write bit line (e.g. WBLB0) is pulled to VDD and the other write bit line (e.g. WBL0) is pulled to VSS. Also during normal operation, a read operation of cell 113 either leaves the read bit line (e.g. RBL0) at the precharged VDD level (and is held there by the PMOS keeper transistor of output driver 127) or pulls the read bit line to VSS because the source of transistor 153 is connected to node 136. In another embodiment, the output driver PMOS keeper may have an additional PMOS transistor in series between it and the VDD supply. The gate electrode of the additional PMOS transistor would be connected to node 136 so that as node 136 is raised above VSS, the conductivity of the additional PMOS transistor is decreased so that the keeper is weakened. This allows the keeper strength to decrease as the read port NMOS pull down strength decreases when node 136 is elevated above VSS. If the PMOS keeper was not weakened, a read "1" failure may occur if node 136 was elevated to such an extent that the read port NMOS conductivity was decreased to the point where it could not overpower the keeper and pull the read bit line low.

During a low voltage mode, the enable signal is driven to a low voltage state where node 136 is pulled to a value above VSS (e.g. VVSS). Accordingly, the voltage across the bit cells of array 102 is reduced by VVSS. In addition, during a write in the low voltage mode, the voltages on either true or complementary write bit lines of the selected columns are pulled to VVSS depending on values being written. In one embodiment, during a write or read in a low voltage mode, the lower supply voltage of the write word lines WWL0 and WWL1 and read word lines RWL1 and RWL0 is at VSS as opposed to the higher voltage VVSS. Using VSS as opposed to VVSS during the lower voltage mode may provide for more fully turned off transistors for unselected lines.

Being able to access (read or write) a memory cell at a reduced voltage across the memory cell may allow for less power to be consumed due to the reduced voltage. In some embodiments, the power consumed in a memory access of a cell is proportional to the square of the voltage across the memory cell times the frequency of operation and the total capacitor of the memory cell. Therefore, reducing the voltage across the memory cell enables a reduction in power during read and write operations. In addition, reducing the voltage across the memory cell for a static condition (no read or write operation) typically reduces the power by one minus the cube of the reduction in the voltage across the cells. Accordingly, the low voltage mode can be unitized when a system that utilizes the memory such as a data processing system is in a low power mode.

Having the lower voltage of the complementary write bit lines (WBL0 and WBLB0) and the lower supply voltage (of node 136) supplied to the sources of transistors 145 and 149 be the same value during a write of a cell (113), in one embodiment, reduces the amount of energy consumed during a write operation in that voltages of the write bit lines WBLB0 and WBL0 are equal to latch node values of 150 and 152, respectively. For example, if write bit line WBL0 where driven to VSS and node 152 was initially at VVSS (a higher voltage) during a write, then current would flow from node 152 down write bit line WBL0 to system ground due to the voltage mismatch.

Furthermore, by having the source of transistor 153 connected to node 136 instead of a system ground terminal (a VSS terminal), transistor 153 is more fully turned off when its being read and node 152 is at the higher low voltage value (VVSS) during a low voltage mode. In this condition, when node 152 is at the higher low voltage of VVSS, transistor 153 would be at a more conductive state if the source of the transistor was at VSS rather than VVSS.

Furthermore, in some embodiments, enabling a memory having cells that can be read or written to in a reduced voltage mode, may allow for a faster read time or write times in the low voltage mode because the voltage across the cells does not have to be changed in order to perform the read or write operation. Thus, a power savings may be made by not requiring the memory to change the voltage across the memory cells to perform a read or write operation.

In some embodiments in the low voltage mode when the memory cells are coupled to receive VVSS, memory 101 may have the ability to couple the lower of the voltage complementary write bit line to VSS (or even a lower voltage) to provide for improved write characteristics (e.g. a write assist). In one example of such an embodiment, the mode controller 112 would provide a second enable signal to configure memory 101 to operate in this mode. For example, referring to FIG. 1, each bit line driver 123 and 125 would include an NMOS transistor to provide a current path to a VSS terminal (or a lower voltage terminal) from the source of the NMOS transistors (e.g. node 128) of the inverters of those drivers. It would also include an additional NMOS transistor that would decouple node 136 from node 128 during such a write and also be used to couple node 128 to node 136 when it would be desired to couple the write bit line to node 136. Both of the gates of the extra NMOS transistors would be controlled by the second enable signal.

Figure 3:
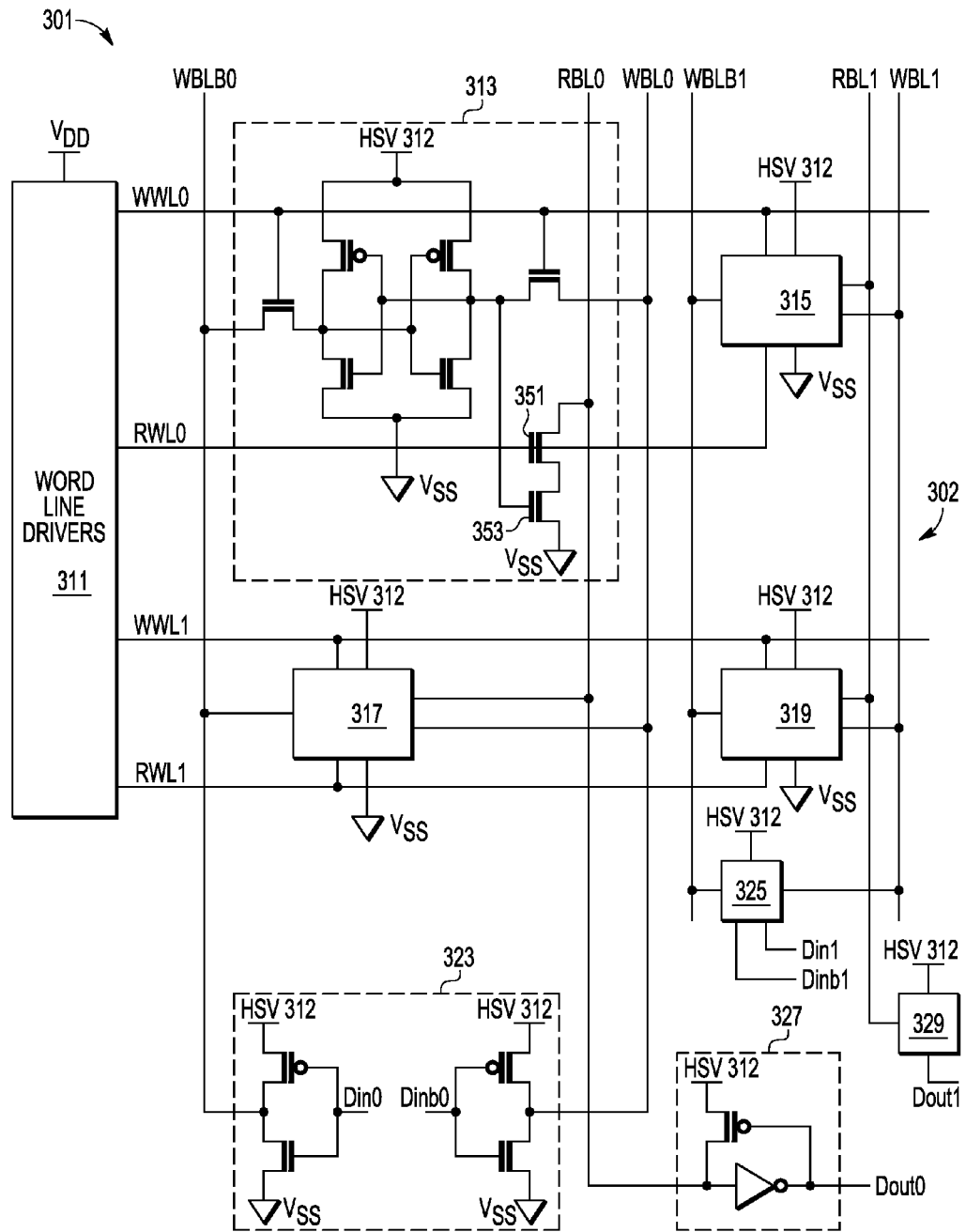
FIG. 3 is a circuit diagram of a memory according to one embodiment of the present invention.

FIG. 3 is a circuit diagram of a memory according to a second embodiment of the present invention. Memory 301 includes an array of memory cells 302 that are arranged in rows and columns. Cells 313 and 315 are coupled to word lines WWL0 and RWL0 and cells 317 and 319 are coupled to word lines WWL1 and RWL1. The words lines are provided by word line drivers 311. Cells 313 and 317 are coupled to complementary write bit lines WBLB0 and WBL0 and read bit line RBL0. Cells 315 and 319 are coupled to complementary write bit lines WBLB1 and WBL1 and read bit line RBL1. In one embodiment, cells 313, 315, 317, and 319 are 8 transistor SRAM cells similar to those shown in FIG. 1, but maybe of other types of memory cells in other embodiments. Memory 301 includes write bit line drivers 323 and 325, where in FIG. 3, the transistors of drivers 325 are not shown. Memory 301 includes output drivers 327 and 329, where in FIG. 3, the transistor and inverter of driver 329 is not shown.

Memory 301 is similar to memory 101 except that instead of being able to adjust the voltage of node 136 between VSS and VVSS, the memory cells (313, 315, 317, and 319) and drivers (323, 325, 327, and 329) are connected to a high supply node 312 (labeled "HSV 312" in FIG. 3) that can selectively provide a voltage of VDD (the high system supply voltage) or a lower voltage of VVDD. In a low voltage mode, the HSV supply node 312 is reduced to the lower voltage VVDD to lower the voltage across the memory cells and to lower the higher voltage of the complementary bit lines during a memory write. Also, the source of the PMOS keeper of the output driver circuits 327 and 329 is provided with VVDD during a low voltage mode so that the keeper strength is weaker to accommodate a weaker memory cell read port (e.g. transistors 351 and 353 for cell 313) pull down when node 312 is lowered below VDD. If the PMOS keeper source was connected to VDD, a read "1" failure may occur if node 312 was lowered to such an extent that the read port NMOS conductivity was decreased to the point where it could not overpower the keeper and pull the read bit line low.

In one embodiment, during a read operation in a low voltage mode, the high voltage state of the write word lines WWL0 and WWL1 and read word lines RWL1 and RWL0 is at VDD as opposed to the lower voltage VVDD.

Reducing the high supply voltage from VDD to VVDD during a low voltage mode acts to reduce the voltage across the memory cells during the low voltage mode. Accordingly, the same power savings can be made as with memory 101 where the voltage across the cells is reduced by raising the voltage of node 136.

Figure 4:
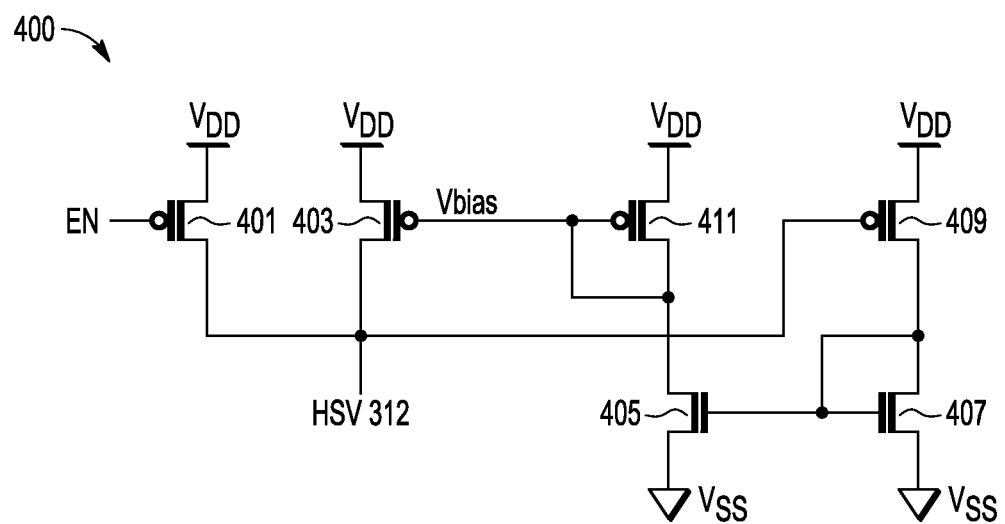
FIG. 4 is a circuit diagram of voltage regulator circuit according to one embodiment of the present invention.

FIG. 4 shows a circuit diagram of one embodiment of a voltage regulator circuit for selectively supplying a lower VVDD voltage at HSV node 312 from VDD during a low voltage mode. Regulator circuit 400 includes select transistor 401 whose input is coupled to an enable signal from a mode controller (not shown). When the enable signal is low, the voltage at node 312 is VDD. When transistor 401 is non conductive due to the enable signal (EN) being high, transistor 409 becomes partially conductive when bit cell leakage current pulls node 312 below VDD and causes transistors 407 and 405 to be partially conductive as well. Transistor 405 being partially conductive causes transistor 411 to be partially conductive as well which causes transistor 403 to be partially conductive. Transistor 403 being partially conductive prevents the leakage current from pulling node 312 too far below VDD. In one embodiment, VVDD is less than VDD by 300 mV, but may be less than VDD by other values in other embodiments. Other embodiments may utilize other types of regulator circuits for selectively providing a lower voltage.

Figure 5:
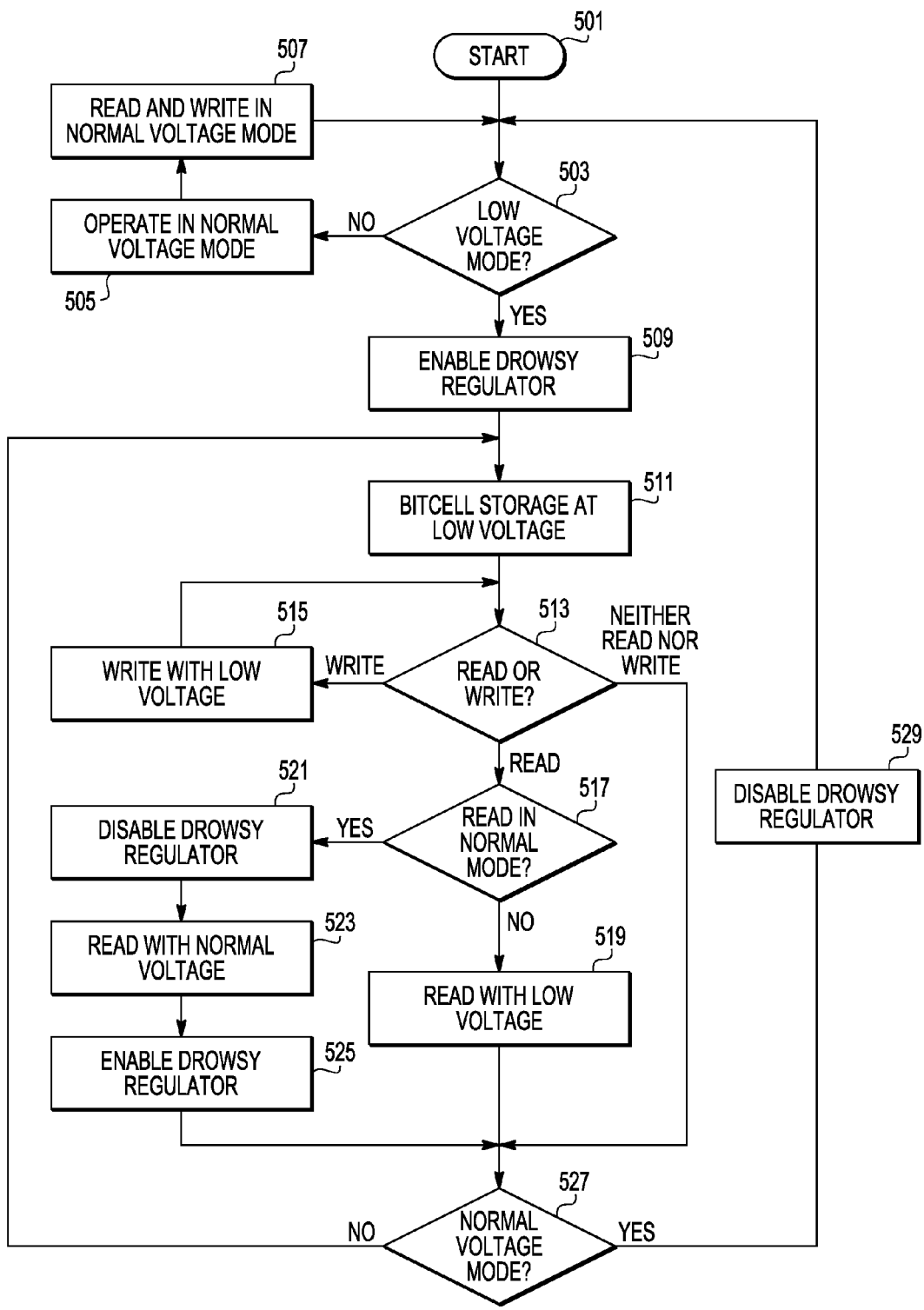
FIG. 5 is a flow diagram of operations of a memory according to one embodiment of the present invention.

FIG. 5 is a flow diagram setting forth memory operations according to one embodiment of the present invention. The flow starts in operation 501. In decision 503, there is a determination of whether the circuit operates in a low voltage mode. If no, in operation 505, the memory operates in a normal voltage mode where the voltage across the cells is VDD-VSS (or VDD). In operation 507, all memory reads and writes are made with the voltage across the cells being VDD and the write bit lines and the read bit lines having a voltage swing of VDD to VSS. A voltage swing of a bit line is a voltage difference between the high voltage state and the low voltage state of the bit line where the voltage state is dependent upon which value is being written or read. If in decision 503, a low voltage mode is desired, then in operation 509, the drowsy regulator circuit (either circuit 131 for the embodiment of FIG. 1 or circuit 400 for the embodiment of FIGS. 3 and 4) is activated where the voltage of node 136 of FIG. 1 is pulled to VVSS or the voltage of node 312 of FIG. 3 is pulled down to VVDD. Due to the activation of the drowsy regulator in operation 509, the voltage across the bit cells is decreased in operation 511.

In response to determining a write request has been made in decision 513, a write is made with the drowsy regulator enabled (with the lower voltage across the memory cells). In one embodiment, the voltage across the memory cells is less than VDD and the voltage swing of the write bit lines is less than VDD as well.

In the embodiment shown, in response to a determination that a read operation is requested in decision 513, the embodiment described has an option of performing the read in the normal voltage mode. If a normal voltage mode is desired, in operation 521, the drowsy regulator is disabled in 521 and the voltage across the cells goes back to VDD where the read is performed in operation 523. In operation 525, the drowsy regulator is re enabled. If in decision 517, a low voltage read is desired, then in operation 519, the read operation is performed with the drowsy regulator enabled and the voltage across the cells is less than VDD (and the voltage swing of the read bit lines is less than VDD as well).

If in decision 513, neither a read nor a write is desired, then the flow transitions to decision 527. If in decision 527, a normal voltage mode is desired, then the drowsy regulator is disabled in 529. Else, the memory remains in a low voltage mode with the voltage across the memory cells being less than VDD. In other embodiments, the decision to go back to the normal voltage mode may be made at other times when the memory is in the low voltage mode.

In other embodiments, a memory may operate in different ways. For example, there may not be the option to exit the low voltage mode to perform a read. Also in other embodiments, the memory may have the option to exit the low voltage mode to perform a memory write. Also, the memory may have the option of implementing a write assist where the voltage across the memory cells is lower than VDD while the write word line is asserted to VDD during a write.

In one embodiment, the memories disclosed herein may be implemented as caches for a data processor. In other embodiments, the memories may be implemented as standalone memories in a data processing system.

One embodiment includes a method of operating a memory comprising memory cells. The method comprises performing a first access on a subset of the memory cells while maintaining a first voltage across the memory cells and performing a second access on the subset of the memory cells while maintaining a second voltage across the memory cells. The second voltage is less than the first voltage. During the performing the first access and the second access, the memory receives a first supply voltage at a first voltage supply terminal and a second supply voltage at a second voltage supply terminal. The first voltage is a difference between the first supply voltage and the second supply voltage.

In another embodiment, a memory comprises a plurality of memory cells. Each memory cell of the plurality of memory cells includes a first voltage supply node and a second voltage supply node. A voltage across a cell of the plurality of memory cells during an access to the cell is a voltage differential between a voltage of the first voltage supply node and a voltage of the second voltage supply node. The memory includes a plurality of word lines. Each memory cell of the plurality of memory cells is coupled to a word line of the plurality of word lines. The memory includes a plurality of bit lines. Each memory cells of the plurality of memory cells is coupled to a bit line of the plurality of bit lines. The memory includes a first system voltage supply terminal, a second system voltage supply terminal, and a voltage regulator circuit coupled to the first system voltage supply terminal and the first voltage supply nodes of the memory cells of the plurality of memory cells. During an access of a memory cell of the plurality of memory cells when in a first mode, the voltage regulator circuit supplies the voltage of the first system voltage supply terminal to the first voltage supply node of the cell such that the voltage access the cell is a first voltage differential. During an access of a memory cell of the plurality of memory cells when in a second mode, the voltage regulator circuit supplies a different voltage than the voltage of the first system voltage supply terminal to the first voltage supply node of the cell such that the voltage across the cell is a second voltage differential that is less than the first voltage differential.

Another embodiment includes a method of operating a memory comprising memory cells. The memory is configured to operate in a normal voltage mode and a low voltage mode. Each memory cell of the memory cells includes a low voltage supply node. The method comprises in the normal voltage mode, supplying the low voltage supply nodes of the memory cells with a system ground supply voltage, and upon transitioning from the normal voltage mode to the low voltage mode, supplying the low voltage supply nodes with a second supply voltage. The second supply voltage is higher than the system ground supply voltage, such that the memory cells are configured to operate with a lower across the cell voltage in the low voltage mode than an across the cell voltage at which the memory cells are configured to operate in the normal voltage mode. The method includes performing an access on a subset of the memory cells using the lower across the cell voltage.

An access to a memory cell is a read of information stored in the memory cell or a write of information to the memory cell.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of operating a memory comprising memory cells, the method comprising:
   performing a first access on a subset of the memory cells while maintaining a first voltage across the memory cells;
   performing a second access on the subset of the memory cells while maintaining a second voltage across the memory cells, the second voltage being less than the first voltage;
   wherein during the performing the first access and the second access, the memory receives a first supply voltage at a first voltage supply terminal and a second supply voltage at a second voltage supply terminal, wherein the first voltage is a difference between the first supply voltage and the second supply voltage;
   each memory cell of the subset of memory cells is coupled to a bit line of a plurality of bit lines;
   wherein for the first access, a voltage swing of the plurality of bit lines is the first voltage;
   wherein for the second access, a voltage swing on the plurality of bit lines is the second voltage.

2. The method of claim 1, wherein the second access is a read.

3. The method of claim 1, wherein the second access is a write.

4. The method of claim 1, wherein:
   each of the memory cells includes a first voltage supply node and a second voltage supply node, wherein a voltage across a memory cell is a voltage differential between a voltage of the first voltage supply node and a voltage of the second voltage supply node;
   the memory includes a voltage regulator circuit coupled to the first voltage supply terminal;
   during the first access, the voltage regulator circuit provides the first supply voltage to the first voltage supply nodes of the subset of memory cells;
   during the second access, the voltage regulator circuit provides a second supply voltage to the first voltage supply nodes of the subset of the memory cells, the second supply voltage is different from the first supply voltage.

5. The method of claim 4, wherein:
   the first voltage supply terminal is a system ground terminal;
   the first supply voltage is system ground;
   the second supply voltage is greater than system ground.

6. The method of claim 4, wherein:
   the first voltage supply terminal is a high system supply voltage terminal;
   the first supply voltage is a high system supply voltage;
   the second supply voltage is less than the high system supply voltage.

7. A method of operating a memory comprising memory cells, the method comprising:
   performing a first access on a subset of the memory cells while maintaining a first voltage across the memory cells;
   performing a second access on the subset of the memory cells while maintaining a second voltage across the memory cells, the second voltage being less than the first voltage;

wherein during the performing the first access and the second access, the memory receives a first supply voltage at a first voltage supply terminal and a second supply voltage at a second voltage supply terminal, wherein the first voltage is a difference between the first supply voltage and the second supply voltage:

wherein the second access is a read;

performing a write to the subset of memory cells while maintaining the second voltage across the memory cells.

8. A method of operating a memory comprising memory cells, the method comprising:

performing a first access on a subset of the memory cells while maintaining a first voltage across the memory cells;

performing a second access on the subset of the memory cells while maintaining a second voltage across the memory cells, the second voltage being less than the first voltage;

wherein during the performing the first access and the second access, the memory receives a first supply voltage at a first voltage supply terminal and a second supply voltage at a second voltage supply terminal, wherein the first voltage is a difference between the first supply voltage and the second supply voltage:

wherein the second access is a read;

wherein each memory cell of the subset of memory cells is coupled to a bit line of a plurality of bit lines;

wherein the first access is a read;

wherein for the read of the first access, a voltage swing of the plurality of bit lines is the first voltage;

wherein for the read of the second access, a voltage swing of the plurality of bit lines is the second voltage.

9. A method of operating a memory comprising memory cells, the method comprising:

performing a first access on a subset of the memory cells while maintaining a first voltage across the memory cells;

performing a second access on the subset of the memory cells while maintaining a second voltage across the memory cells, the second voltage being less than the first voltage;

wherein during the performing the first access and the second access, the memory receives a first supply voltage at a first voltage supply terminal and a second supply voltage at a second voltage supply terminal, wherein the first voltage is a difference between the first supply voltage and the second supply voltage;

wherein the second access is a write;

wherein each memory cell of the subset of memory cells is coupled to a bit line of a plurality of bit lines;

wherein the first access is a write;

wherein for the write of the first access, a voltage swing of the plurality of bit lines is the first voltage;

wherein for the write of the second access, the voltage swing on the plurality of bit lines is the second voltage.

10. A method of operating a memory comprising memory cells, the method comprising:

performing a first access on a subset of the memory cells while maintaining a first voltage across the memory cells;

performing a second access on the subset of the memory cells while maintaining a second voltage across the memory cells, the second voltage being less than the first voltage;

wherein during the performing the first access and the second access, the memory receives a first supply voltage at a first voltage supply terminal and a second supply voltage at a second voltage supply terminal, wherein the first voltage is a difference between the first supply voltage and the second supply voltage;

wherein the subset of memory cells is coupled to a word line;

wherein during the first access, a voltage difference between an asserted state of the word line and an unasserted state of the word line is the first voltage;

wherein during the second access, a voltage difference between the asserted state of the word line and the unasserted state of the word line is the first voltage.

11. A memory comprising:

a plurality of memory cells, each memory cell of the plurality of memory cells includes a first voltage supply node and a second voltage supply node, wherein a voltage across a memory cell of the plurality of memory cells during an access to the memory cell is a voltage differential between a voltage of the first voltage supply node and a voltage of the second voltage supply node;

a plurality of word lines, each memory cell of the plurality of memory cells is coupled to a word line of the plurality of word lines;

a plurality of bit lines, each memory cell of the plurality of memory cells is coupled to a bit line of the plurality of bit lines;

a first system voltage supply terminal;

a second system voltage supply terminal;

a voltage regulator circuit coupled to the first system voltage supply terminal and the first voltage supply nodes of the memory cells of the plurality of memory cells;

wherein during an access that is characterized as a write access of a memory cell of the plurality of memory cells when in a first mode, the voltage regulator circuit supplies the voltage of the first system voltage supply terminal to the first voltage supply node of the memory cell such that the voltage access the memory cell is a first voltage differential;

wherein during an access that is characterized as a write access of a memory cell of the plurality of memory cells when in a second mode, the voltage regulator circuit supplies a different voltage than the voltage of the first system voltage supply terminal to the first voltage supply node of the memory cell such that the voltage across the memory cell is a second voltage differential that is less than the first voltage differential.

12. The memory of claim 11, wherein the first system voltage supply terminal is system ground and the first voltage supply nodes are low voltage supply nodes of the memory cells of the plurality of memory cells.

13. The memory of claim 11, wherein the first system voltage supply terminal is a system high voltage supply terminal and the first voltage supply nodes of the memory cells of the plurality of memory cells are high voltage supply nodes of the memory cells of the plurality of memory cells.

14. The memory of claim 11, wherein each of the plurality of memory cells is an SRAM memory cell.

15. The memory of claim 11, wherein each of the plurality of memory cells is an 8 transistor memory cell.

16. The memory of claim 11, wherein:

during the access to a memory cell of the plurality of memory cells in the first mode, a voltage difference between an asserted state of a word line coupled to the memory cell and an unasserted state of the word line is the first voltage differential;

during the access to a memory cell of the plurality of memory cells in the second mode, a voltage difference between an asserted state of a word line coupled to the memory cell and an unasserted state of the word line is the first voltage differential.

17. The memory of claim 11, wherein:
during the access to a memory cell of the plurality of memory cells in the first mode, a voltage difference between an asserted state of a word line coupled to the memory cell and an unasserted state of the word line is the first voltage differential;
during the access to a memory cell of the plurality of memory cells in the second mode, a voltage difference between an asserted state of a word line coupled to the memory cell and an unasserted state of the word line is the first voltage differential.

18. A memory comprising:
a plurality of memory cells, each memory cell of the plurality of memory cells includes a first voltage supply node and a second voltage supply node, wherein a voltage across a memory cell of the plurality of memory cells during an access to the memory cell is a voltage differential between a voltage of the first voltage supply node and a voltage of the second voltage supply node;
a plurality of word lines, each memory cell of the plurality of memory cells is coupled to a word line of the plurality of word lines;
a plurality of bit lines, each memory cell of the plurality of memory cells is coupled to a bit line of the plurality of bit lines;
a first system voltage supply terminal;
a second system voltage supply terminal;
a voltage regulator circuit coupled to the first system voltage supply terminal and the first voltage supply nodes of the memory cells of the plurality of memory cells;
wherein during an access of a memory cell of the plurality of memory cells when in a first mode, the voltage regulator circuit supplies the voltage of the first system voltage supply terminal to the first voltage supply node of the memory cell such that the voltage access the memory cell is a first voltage differential;
wherein during an access of a memory cell of the plurality of memory cells when in a second mode, the voltage regulator circuit supplies a different voltage than the voltage of the first system voltage supply terminal to the first voltage supply node of the memory cell such that the voltage across the memory cell is a second voltage differential that is less than the first voltage differential;
during the access to a memory cell of the plurality of memory cells in the first mode, a voltage difference between an asserted state of a word line coupled to the memory cell and an unasserted state of the word line is the first voltage differential;
during the access to a memory cell of the plurality of memory cells in the second mode, a voltage difference between an asserted state of a word line coupled to the memory cell and an unasserted state of the word line is the first voltage differential.

19. A memory comprising:
a plurality of memory cells, each memory cell of the plurality of memory cells includes a first voltage supply node and a second voltage supply node, wherein a voltage across a memory cell of the plurality of memory cells during an access to the memory cell is a voltage differential between a voltage of the first voltage supply node and a voltage of the second voltage supply node;
a plurality of word lines, each memory cell of the plurality of memory cells is coupled to a word line of the plurality of word lines;
a plurality of bit lines, each memory cell of the plurality of memory cells is coupled to a bit line of the plurality of bit lines;
a first system voltage supply terminal;
a second system voltage supply terminal;
a voltage regulator circuit coupled to the first system voltage supply terminal and the first voltage supply nodes of the memory cells of the plurality of memory cells;
wherein during an access of a memory cell of the plurality of memory cells when in a first mode, the voltage regulator circuit supplies the voltage of the first system voltage supply terminal to the first voltage supply node of the memory cell such that the voltage access the memory cell is a first voltage differential;
wherein during an access of a memory cell of the plurality of memory cells when in a second mode, the voltage regulator circuit supplies a different voltage than the voltage of the first system voltage supply terminal to the first voltage supply node of the memory cell such that the voltage across the memory cell is a second voltage differential that is less than the first voltage differential;
during the access to a memory cell of the plurality of memory cells in the first mode, a voltage swing of a bit line of the plurality of bit lines coupled to the memory cell is the first voltage differential;
during the access to a memory cell of the plurality of memory cells in the second mode, a voltage swing of a bit line of the plurality of bit lines coupled to the memory cell is the second voltage differential.

20. A method of operating a memory comprising memory cells, wherein the memory is configured to operate in a normal voltage mode and a low voltage mode, wherein each memory cell of the memory cells includes a low voltage supply node, the method comprising:
in the normal voltage mode, supplying the low voltage supply nodes of the memory cells with a system ground supply voltage;
upon transitioning from the normal voltage mode to the low voltage mode, supplying the low voltage supply nodes with a second supply voltage, wherein the second supply voltage is higher than the system ground supply voltage, such that the memory cells are configured to operate with a lower across the memory cell voltage in the low voltage mode than an across the memory cell voltage at which the memory cells are configured to operate in the normal voltage mode; and
performing an access on a subset of the memory cells using the lower across the memory cell voltage:
wherein the memory further includes a plurality of write bit lines each coupled to a bit line driver of a plurality of bit line drivers, each bit line driver of the plurality including a low voltage supply node;
during the normal voltage mode, supplying the system ground supply voltage to the low voltage supply nodes of the plurality of bit line drivers;
during the low voltage mode, supplying the second supply voltage to the low voltage supply nodes of the plurality of bit line drivers.

* * * * *